(12) United States Patent
Furenlid et al.

(10) Patent No.: US 11,716,092 B2
(45) Date of Patent: Aug. 1, 2023

(54) OPTIMIZABLE ANALOG-TO-DIGITAL CONVERTER FOR UNIPOLAR OR BIPOLAR PULSE SIGNALS BASED ON MULTI-BIT SIGMA-DELTA MODULATION

(71) Applicant: ARIZONA BOARD OF REGENTS ON BEHALF OF THE UNIVERSITY OF ARIZONA, Tucson, AZ (US)

(72) Inventors: Lars R. Furenlid, Tucson, AZ (US); Maria Ruiz-Gonzalez, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 30 days.

(21) Appl. No.: 17/467,229

(22) Filed: Sep. 5, 2021

(65) Prior Publication Data

US 2021/0399737 A1 Dec. 23, 2021

Related U.S. Application Data

(63) Continuation-in-part of application No. 16/759,531, filed as application No. PCT/US2018/057426 on Oct. 25, 2018, now Pat. No. 11,115,045.

(Continued)

(51) Int. Cl.
   *H03M 3/00* (2006.01)
(52) U.S. Cl.
   CPC .................................. *H03M 3/324* (2013.01)

(58) Field of Classification Search
   CPC ...... H03M 3/324; H03M 3/428; H03M 3/464; H03M 3/476; H03M 1/664
   (Continued)

(56) References Cited

U.S. PATENT DOCUMENTS 6,061,008 A * 5/2000 Abbey .................. H03M 3/406
   341/143
6,642,873 B1 11/2003 Kuang
   (Continued)

FOREIGN PATENT DOCUMENTS

WO WO-0237685 A2 * 5/2002 .............. H03M 1/20

*Primary Examiner* — Lam T Mai
(74) *Attorney, Agent, or Firm* — Stuart H. Mayer; Mayer & Williams PC

(57) ABSTRACT

A delta sigma modulator includes a summation circuit, at least one integrator, a multi-bit quantizer and a negative feedback circuit. The summation circuit is configured to produce a difference signal between a unipolar or bipolar analog input signal and an analog feedback signal. The integrator is operatively coupled to the summation circuit to integrate the difference signal. The multi-bit quantizer is operatively coupled to the integrator to digitize the integrated signal to generate an N-bit digital output signal, N being an integer greater than 1. The negative feedback circuit operatively couples the multi-bit quantizer to the summation circuit. The negative feedback circuit includes a digital-to-analog converter arrangement for receiving the N-bit digital output signal and providing the analog feedback signal such that digital values of the N-bit digital output signal and values of the analog feedback encoded by the digital values have a non-linear relationship to one another.

15 Claims, 10 Drawing Sheets

Related U.S. Application Data

(60) Provisional application No. 62/577,007, filed on Oct. 25, 2017.

(58) Field of Classification Search
USPC .......................................................... 341/143
See application file for complete search history.

(56) References Cited

U.S. PATENT DOCUMENTS

| | | | |
|---|---|---|---|
| 8,085,176 B2 | 12/2011 | Deval et al. | |
| 9,077,363 B2* | 7/2015 | MacLeod | H03M 1/1245 |
| 9,148,169 B2 | 9/2015 | Kabir | |
| 10,735,021 B2 | 8/2020 | Herve | |
| 10,840,940 B2* | 11/2020 | YiN | H03M 3/448 |
| 10,992,310 B2* | 4/2021 | Koli | H03M 3/464 |
| 11,251,807 B1* | 2/2022 | Ren | H03M 3/458 |
| 11,303,295 B1* | 4/2022 | Liang | H03M 7/3026 |
| 2003/0184463 A1 | 10/2003 | Zierhofer | |
| 2008/0129569 A1 | 6/2008 | Muhammad | |
| 2011/0006937 A1 | 1/2011 | Zoso | |
| 2012/0194369 A1 | 8/2012 | Galton | |
| 2014/0035768 A1 | 2/2014 | Hu | |
| 2016/0308698 A1 | 10/2016 | Talty | |
| 2017/0179972 A1* | 6/2017 | Petilli | H03M 1/1245 |
| 2020/0204193 A1* | 6/2020 | Yin | H03M 3/368 |
| 2021/0175897 A1* | 6/2021 | Theiler | H03M 3/43 |
| 2021/0314201 A1* | 10/2021 | Nikitin | H04L 25/08 |
| 2022/0173751 A1* | 6/2022 | Modaffari | H03M 3/452 |
| 2022/0345150 A1* | 10/2022 | Modaffari | H03M 3/384 |

\* cited by examiner

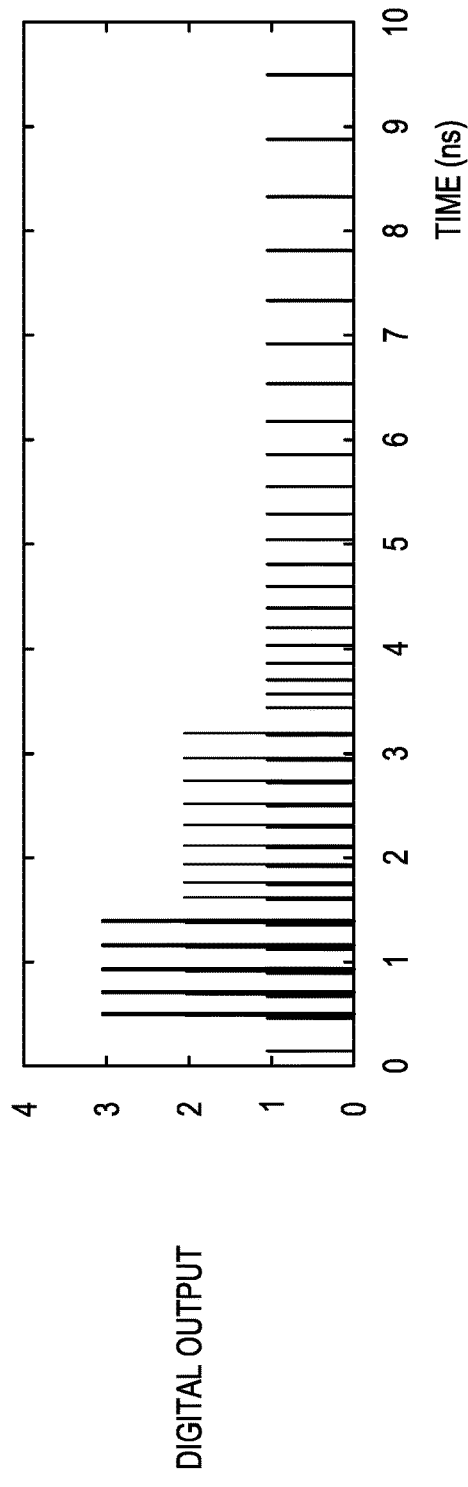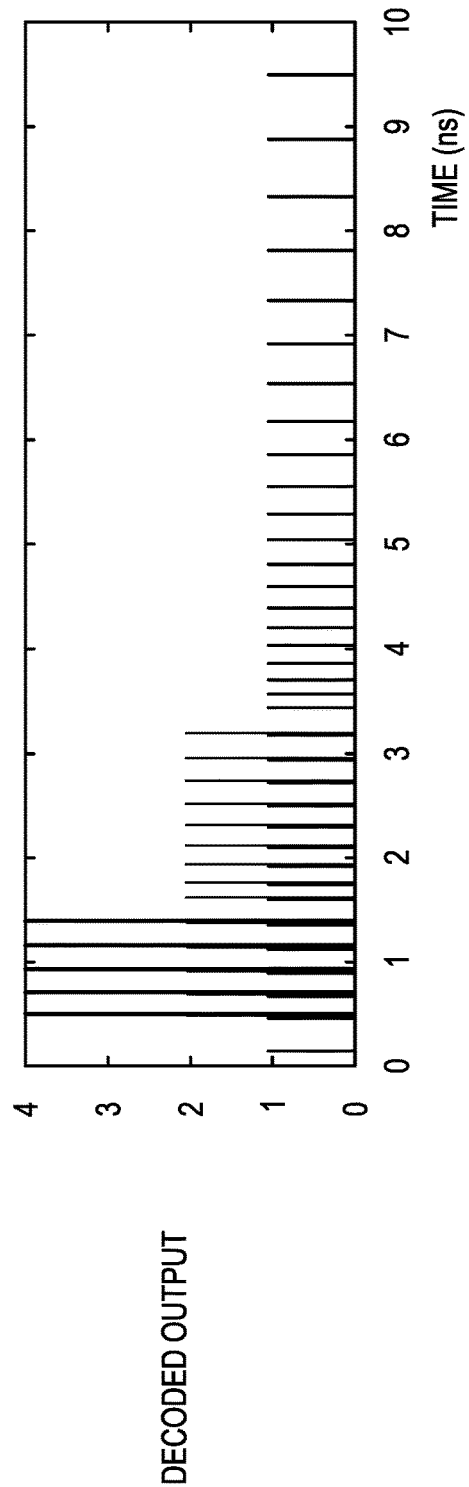

OPTIMIZABLE ANALOG-TO-DIGITAL CONVERTER FOR UNIPOLAR OR BIPOLAR PULSE SIGNALS BASED ON MULTI-BIT SIGMA-DELTA MODULATION

GOVERNMENT FUNDING

This invention was made with government support under Grant Nos. P41 EB002035 and R01 EB022521, awarded by NIH. The government has certain rights in the invention.

BACKGROUND

Single-bit sigma-delta modulation (alternatively known as delta-sigma modulation) is a known technique for digitizing and storing electronic waveforms such as those associated with sound and music. It is the method used in the music disk technology known as Super-Audio Compact Disc (SACD).

Sigma-delta technology employs oversampling—sampling at a rate much greater than the Nyquist rate such that a majority of quantization noise (caused during conversion) is shifted to a frequency band greater than the signal bandwidth. The shift enables subsequent filtering of the noise. Sigma-delta technology thus enables high signal-to-noise ratios (SNRs).

Single-bit digitization captures the changes in the amplitude of a signal as a function of time (the delta portion of sigma-delta modulation) rather than repeatedly recording the amplitude of the signal directly. Accuracy in being able to follow a complex waveform derives from sampling with this single bit very rapidly so that the digital values are keeping up with changing analog input. For the SACD format, the sampling rate is 2.8224 MHz, which is 64 times higher than the 44.1 kHz sampling that is needed due to Nyquist to accurately capture the upper end of the audible spectrum at 22 kHz.

From any starting point, the amplitude of the signal at any later time can be recovered by adding together the difference signals that have occurred in between, hence the sigma, indicating a summation, in sigma-delta modulation. Among the key advantages of the single-bit approach are that the signal can be sent on a single trace (a ground is also required, but one ground can serve many channels of data), that even very fast single-bit digitization does not consume much power or require many components, and that noise is distributed throughout the spectrum in an advantageous manner.

FIG. 1 is a block diagram of a conventional single-bit sigma-delta analog-to-digital (ADC) converter 100. As shown, the converter includes a summation circuit 110, an integrator 120, a comparator 130 and a one-bit digital-to-analog converter (DAC) 140. An analog input signal is received by the summation circuit 110 from which a negative feedback signal (provided by the DAC) is subtracted. The integrator 120 integrates the difference signal provided by the summation circuit 110. The integrated signal is directed to the comparator 130, which converts the integrated signal to a one-bit digital signal. The output from the comparator 130 is directed to the DAC 140, which generates the analog negative feedback signal.

For signals that have rapid transients, such as the pulses associated with the sudden deposition of energy when an x-ray or gamma-ray photon interacts in a detector material, 1-bit digitization is not able to keep up with the analog waveform—the digitizer goes into a period of overload until it catches up. Nonetheless, there is the possibility of recovering the integral under the pulse—which in some circumstances is all the information that is needed. This is explored in the attached paper by Z. Zhao et al.

However, for many applications, the shape of the waveform contains important information. An example is that the shape of the pulse may be a function of the depth in the detector where the interaction occurred or the shape may be indicative of whether the deposition occurred in a small volume in the detector or involved scatter that distributed energy in a larger volume. The shape of the waveform can also reveal whether another pulse occurred within the time occupied by a first pulse, i.e., was subject to the phenomenon known as pulse pileup.

SUMMARY

In accordance with one aspect of the subject matter disclosed herein, a delta sigma modulator is provided that includes a summation circuit, at least one integrator, a multi-bit quantizer and a negative feedback circuit. The summation circuit is configured to produce a difference signal between an analog input signal and an analog feedback signal. The integrator is operatively coupled to the summation circuit to integrate the difference signal. The multi-bit quantizer is operatively coupled to the integrator to digitize the integrated signal to generate an N-bit digital output signal, N being an integer greater than 1. The negative feedback circuit operatively couples the multi-bit quantizer to the summation circuit. The negative feedback circuit includes a digital-to-analog converter arrangement for receiving the N-bit digital output signal and providing the analog feedback signal such that digital values of the N-bit digital output signal and values of the analog feedback encoded by the digital values have a non-linear relationship to one another.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. It will be appreciated that the above-described subject matter may be implemented as a computer-controlled apparatus, a computer process, a computing system, or as an article of manufacture such as one or more computer-readable storage media. These and various other features will be apparent from a reading of the following Detailed Description and a review of the associated drawings.

BRIEF DESCRIPTION OF THE DRAWINGS

FIG. 5b shows the two-bit binary word of the digital output signal; and FIG. 5c shows the decoded values obtained from the digital output signal.

DETAILED DESCRIPTION

Figure 1:
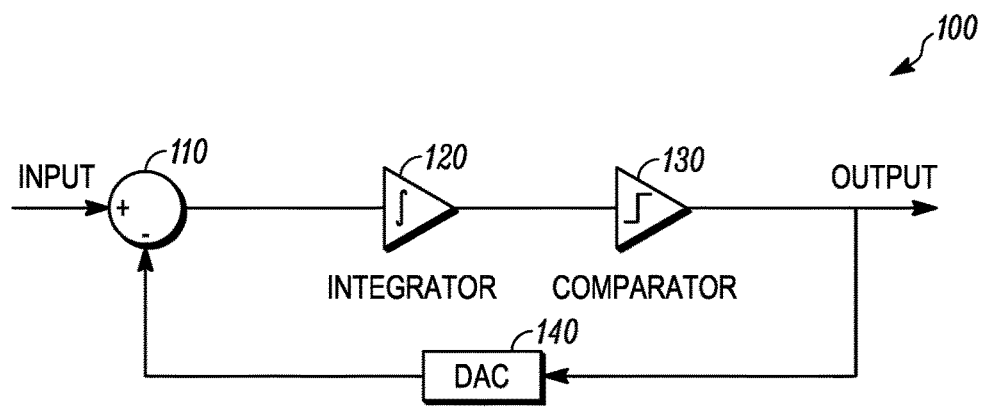
FIG. 1 is a block diagram of a conventional single-bit sigma-delta analog-to-digital (ADC) converter.

The aforementioned limitations of single-bit sigma-delta modulation when used to digitize pulse waveforms or the like are addressed by adding one or more additional bits to perform multi-bit sigma-delta modulation. In a single-bit sigma-delta modulator, only a single bit binary word is used for the digital output signal that is provided to the DAC, which thus represents two levels of quantization. That is, a bit of zero represents one level of quantization and a bit of 1 represents a second level of quantization. The DAC in the negative feedback path of the single bit modulator decodes the single bit binary word to produce the analog value that represents each quantization level.

Multi-bit sigma-delta modulators, on the other hand, employ more than one bit for the digital output signal. Since the digital output signal employs a multiple bit binary word, more than two levels of quantization can be represented. For example, a two-bit sigma-delta modulator has a two bit digital output signal and thus can encode four levels of quantization since a two bit binary word can represent the numbers 0-3. The DAC in the negative feedback path of a conventional multiple bit modulator decodes the multiple bit binary word to produce the analog value that represents each quantization level.

Conventional multi-bit sigma-delta modulators have a linear relationship between the multi-bit digital output signal and the quantization values encoded by those multi-bit digital output signals. That is, a two digital output signal has the four values 00, 01, 10 and 11, which when decoded by the DAC might represent the actual amplitude values 10, 20, 30 and 40. Stated differently, in a conventional multi-bit sigma-delta modulator the different levels of quantization have equal step sizes between them.

In contrast to a conventional multi-bit sigma-delta modulator, the multi-bit sigma-delta modulator described herein may have a non-linear relationship between the multi-bit digital output signal and the actual values or quantization levels encoded by those multi-bit digital output signals. For example, a two digital output signal having the four values 00, 01, 10 and 11, which when decoded might represent actual amplitude values of, say, 0, 1, 16, 64 or alternatively, 0, 1, 7 and 13. It should be noted that these examples have been arbitrarily chosen for illustrative purposes and that more generally any nonlinear mapping may be employed between the multi-bit binary word values of the digital output signal and the actual values encoded by those multi-bit binary word values. Moreover, adding additional bits to the binary word of the digital output signal would allow even more levels of quantization to be employed, but since the complexity of the design increases rapidly with more bits, and one of the key advantages of sigma-delta modulation is the accurate representation of waveforms with as few bits as possible, it is anticipated that it will generally be desirable to use as few bits as necessary.

As previously mentioned, a key feature of sigma-delta technology is that the sampling rate is much greater than the Nyquist rate. While this technique is suitable for many types of analog signals that are to be digitized, it can be problematic when the analog signal includes rapid transients such as pulses. In this case the analog signal may have Fourier components that would require sampling rates above the Nyquist rate that are impractical to perform. It has been found, however, that by appropriate selection of the quantization levels to be encoded by the multi-bit digital output signals, it is possible to preserve the shape of the pulses while using realistic sampling frequencies. In general, these quantization levels will have a nonlinear relationship to the multi-bit binary word values that encode them.

For instance, pulse shapes in radiation-sensor applications are typically dominated by the crystal material, dopants, and geometry. By knowing the expected rise and decay times that are present, either from tabulated data or from calibration measurements, the increments between quantization levels can be selected which yield the most accurate representations of the analog signals, for example, in comparison with the digitized traces in an amplitude-digitizing measuring system such as an oscilloscope. In other words, the increments between quantization levels corresponding to the multi-bit binary words of the digital output signals may be selected to match the temporal properties of the analog input signal.

Figure 2:
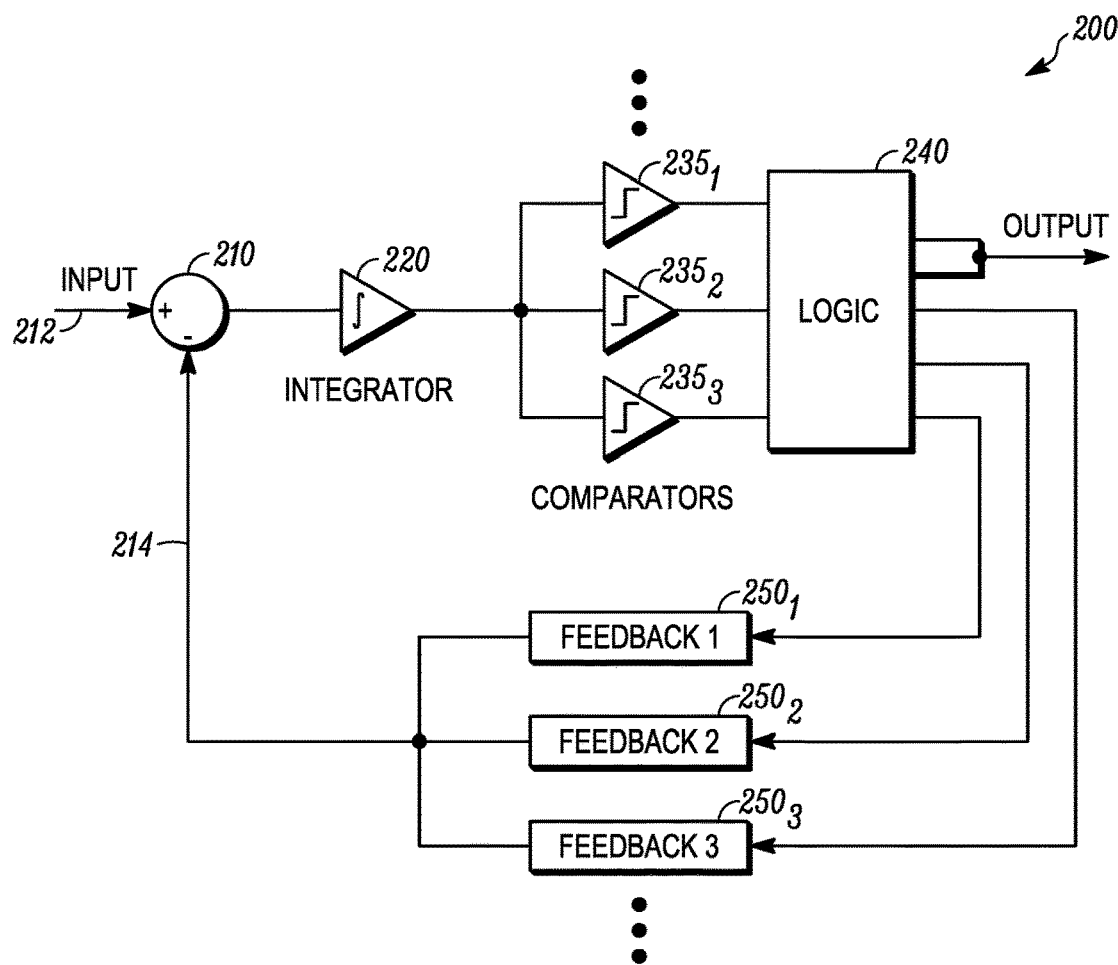
FIG. 2 shows a schematic block diagram of one example of a two-bit sigma-delta modulator.

FIG. 2 shows a schematic block diagram of one example of a two-bit sigma-delta modulator 200. The modulator 200 includes a summation circuit 210 that produces a difference signal between an analog input signal 212 and an analog feedback signal 214. An integrator 220 receives the difference signal from the summation circuit 210 and provides an integrated signal to a multi-bit quantizer that digitizes the integrated signal to generate a two bit digital output signal. In the example of FIG. 2 the multi-bit quantizer includes three comparators $235_1$, $235_2$ and $235_3$ that have different and increasing threshold levels. The integrated signal is compared against the three thresholds and digital logic 240 determines the highest threshold that has been exceeded. The two-bit binary word output by the digital logic 240 is used to select one of three digital-to-analog converter (DACs) $250_1$, $250_2$ and $250_3$ (represented in FIG. 2 by feedback 1, feedback 2 and feedback 3) to send an analog negative feedback signal 214 to the summation circuit 210. Each DAC will provide an analog feedback signal with a different amplitude to the summation circuit 210. As discussed above, the relationship between the two-bit binary word output by the digital logic 240 and the amplitude of the analog feedback signal that is provided to the summation circuit 210 is nonlinear. That is, the scaling factor between each binary word and the corresponding analog feedback signal is different for each DAC. In this example the nonlinear relationship is achieved because the three DACs are separately addressable.

While the particular example of the multi-bit sigma-delta modulator shown in FIG. 2 is a two-bit modulator, more generally any number of bits that are desired may by employed. For the particular configuration shown in FIG. 2, the number of DACs that are required is equal to the number of levels that the multi-bit binary word is able to encode. Likewise, in this particular configuration the number of comparators that is required is equal to the number of DACs that is employed. Of course, the multi-bit sigma-delta modulator described herein may be configured differently from that shown in FIG. 2. For instance, in some embodiments the number of DACs that are required may be less than the number of levels that the multi-bit binary word is able to encode. For example, if a 3 bit binary word is used, which can provide up to 8 quantization levels, and only 6 quantization levels are required for a particular application, then only 6 DACs would be required.

Figure 3:
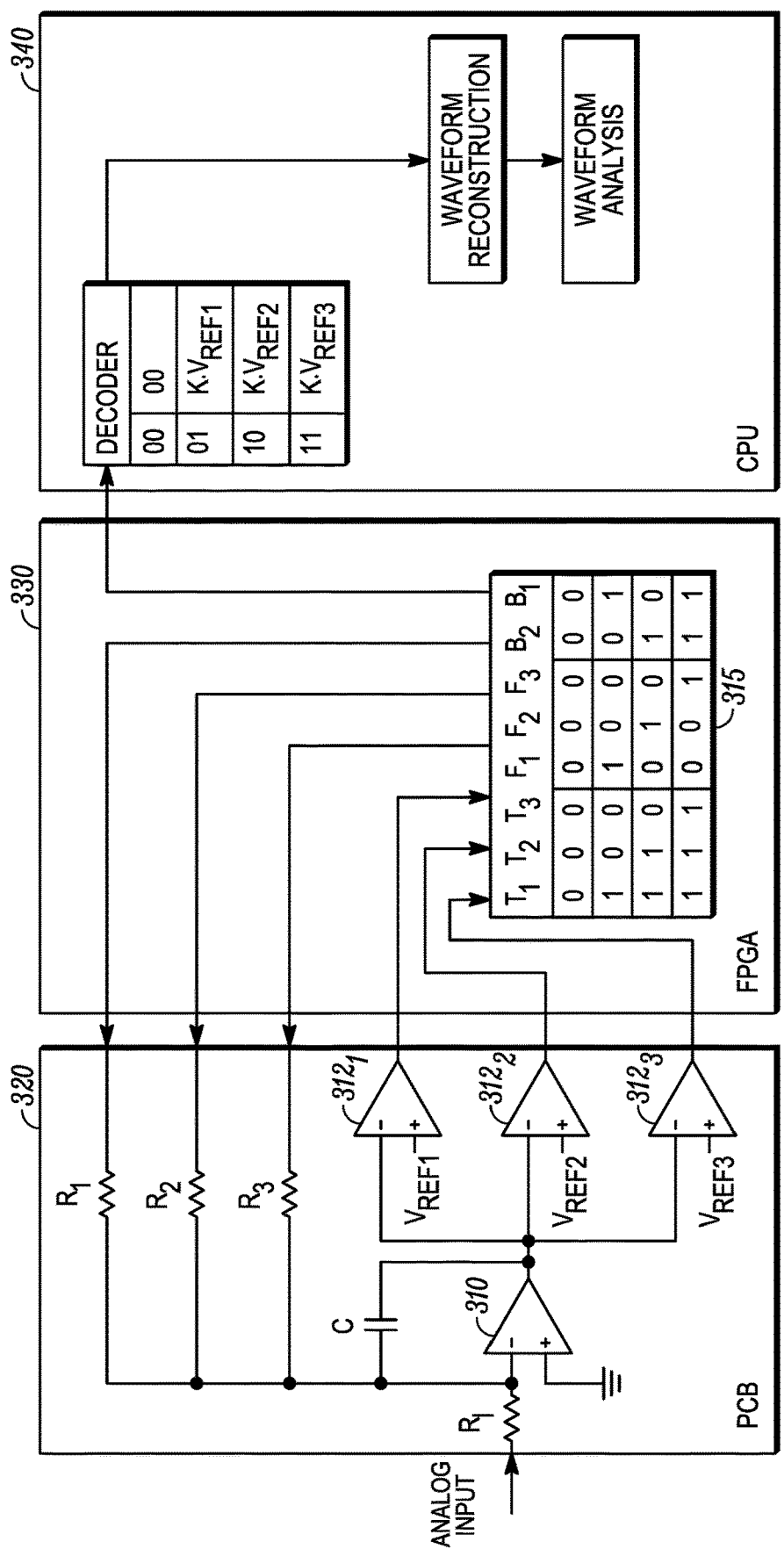
FIG. 3 shows one example of an arrangement that may be used to implement the particular configuration of the multi-bit sigma-delta modulator shown in FIG. 2.

FIG. 3 shows one example of an arrangement that may be used to implement the particular configuration of the multi-bit sigma-delta modulator shown in FIG. 2. The arrangement includes an analog component implemented on a printed circuit board 320 (PCB), digital logic implemented on a field-programmable gate array (FPGA) 330, and a CPU 340. For a two-bit delta-sigma modulator, the input voltage-pulse signal is fed via a resistor Ri into an integrating circuit component 310 that integrates the resulting current. The voltage output of the integrator 310 is simultaneously compared against three thresholds of increasing level in three comparators. $312_1$, $312_2$ and $312_3$. Three feedback resistors $R_1$, $R_2$ and $R_3$ determine the feedback-impulse amplitudes. In this example comparator $312_1$ has the largest threshold level and comparator $312_3$ the smallest. Likewise, feedback resistor R1 has the smallest resistance and resistor $R_3$ the largest. The binary output from the comparators $312_1$, $312_2$ and $312_3$ is sent to a field-programmable gate array (FPGA) in which digital logic 315 determines which of the thresholds is the highest that has been exceeded. The digital logic 315 also determines the feedback-impulse amplitude by selecting any one (or none) of the feedback resistors $R_1$, $R_2$ and $R_3$ at each clock cycle The output of the digital logic 315 is used to select an increment of current that will be subtracted from the integrator to null the input. The logic is combined into two bits that form the digital output in order to indicate for this time interval which thresholds were exceeded (e.g., none=00, threshold 1=01, threshold 2=10 and threshold 3=11). The two bit output is sent to the CPU 340 to be decoded into the corresponding values, which are proportional to the reference voltages $V_{ref1}$, $V_{ref2}$ and $V_{ref3}$ of the comparators $312_1$, $312_2$ and $312_3$ by a proportionality constant K. The input pulse can be recovered from the two-bit digital representation by using the digital codes to indicate which value (0, DAC1, DAC2, or DAC3) should be added to the running sum.

It should be noted that the techniques described herein may be applicable to multi-bit delta sigma modulators having more complex architectures than those described above. For example, the delta-sigma modulator can employ feedback to a single summing node at the input of a single integrator, or feedback to multiple summing nodes at the inputs of multiple integrators to form a first order modulator, a second order modulator, etc. As another example, the techniques described herein may be applied to a cascaded delta-sigma modulator, which is a modulator having more than one stage of single or multiple-order integrators cascaded together. An interstage summing node is typically used between the stages, and serves to scale down the analog feedback signal.

In some embodiments the increments that the multi-bit binary word encodes can be optimized for the pulse shapes that will be encountered in the measurement. For instance, pulse shapes in radiation-sensor applications are typically dominated by the crystal material, dopants, and geometry. If the expected rise and decay times of the pulses in the analog input signal are known, either from tabulated data or from calibration measurements, the increments can be selected that yield the most accurate representations of the analog signals by comparison, for example, with digitized traces in an amplitude-digitizing measuring system such as an oscilloscope. In this way the increments or quantization levels corresponding to the digital binary words can be adapted to match the analog input signal's temporal properties. This adaptation can be performed by making the increments that the multi-bit binary word encodes programmable or otherwise adjustable. As a result, the increments can be tailored to the pulses in the analog input signal that is to be digitized. As noted above, this can be accomplished, for example, by using tabulated data or by using calibration signals.

The optimization can be performed in an off-line step, with programmable increments. Once the parameters are found, a final optimized multi-bit sigma-delta modulator can be built with fixed parameters that are not programmable or adjustable, but are optimized for a specific detector and/or application.

Figure 4:
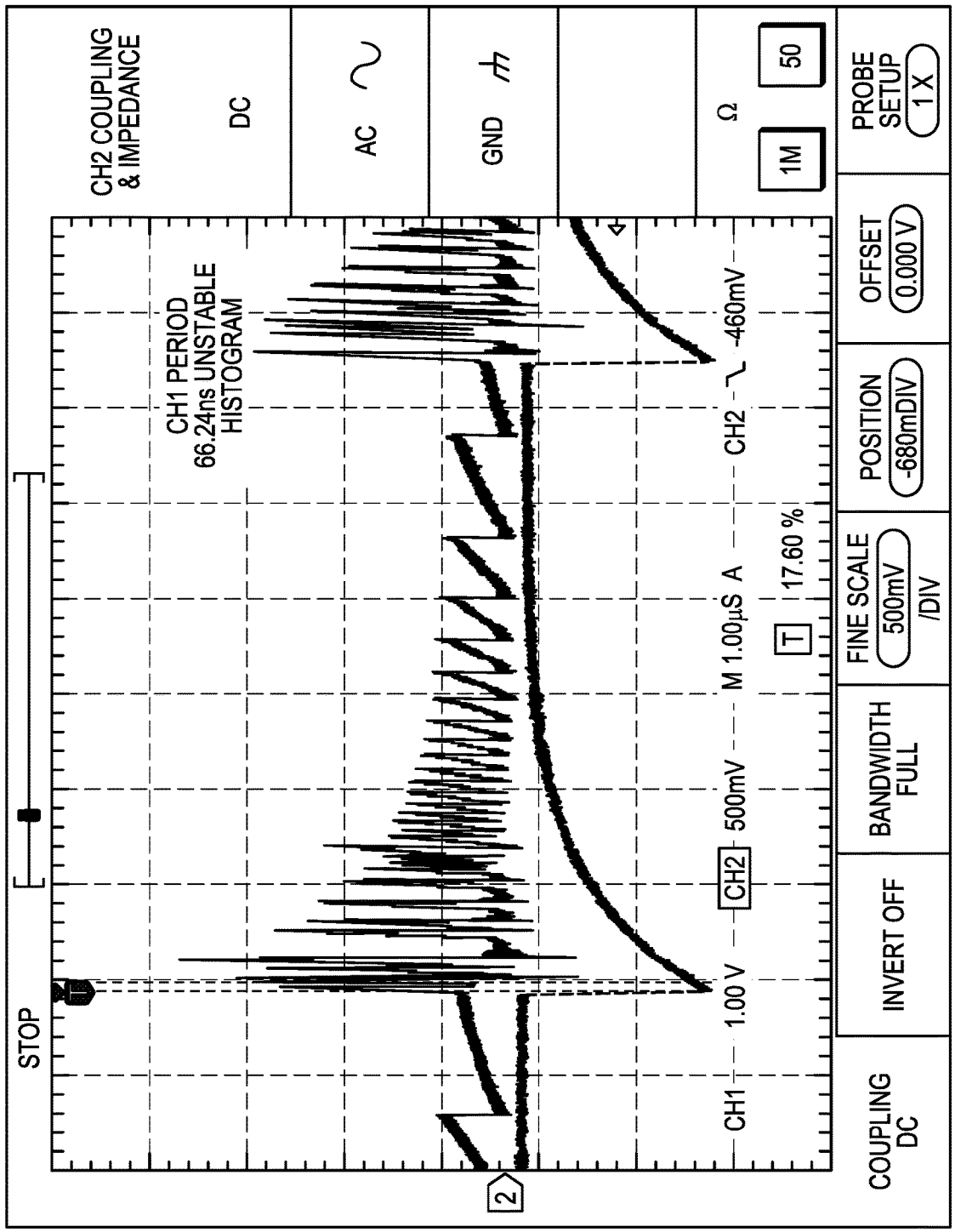
FIG. 4 is an oscilloscope trace showing the multi-bit sigma-delta modulator in operation.

FIG. 4 is an oscilloscope trace showing the multi-bit sigma-delta modulator in operation. The lower curve is the input analog signal and the upper curve is the output of the integrator, which clearly shows the subtracted increments.

Figure 5A:
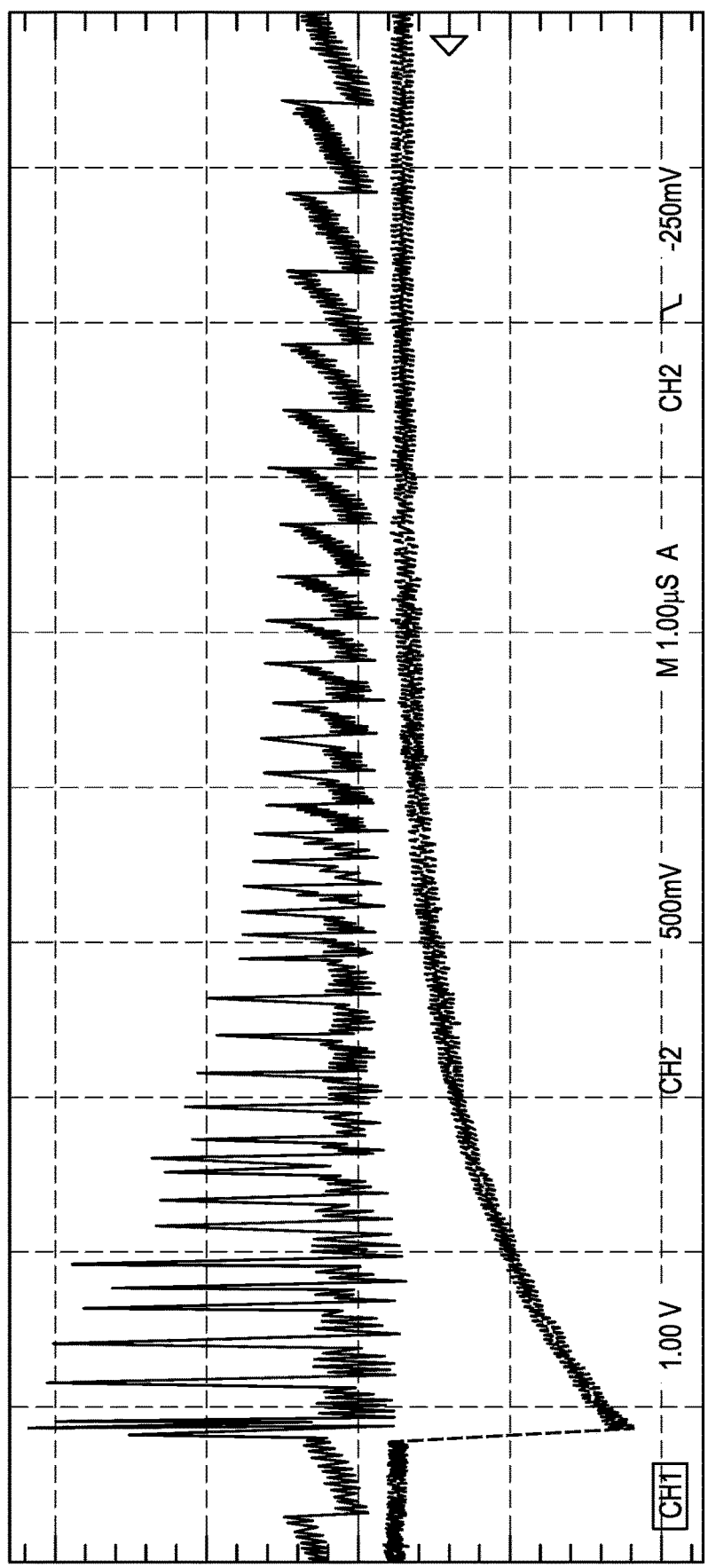
FIG. 5a shows another oscilloscope trace similar to the trace shown in FIG. 4.

FIG. 5a shows another oscilloscope trace similar to the trace shown in FIG. 4. FIG. 5b shows the two-bit binary word of the digital output signal, which consists of the values 0, 1, 2 and 3. FIG. 5c shows the decoded values obtained from the digital output signal, which in this case are 0, 1, 2 and 4.

Figure 6A:
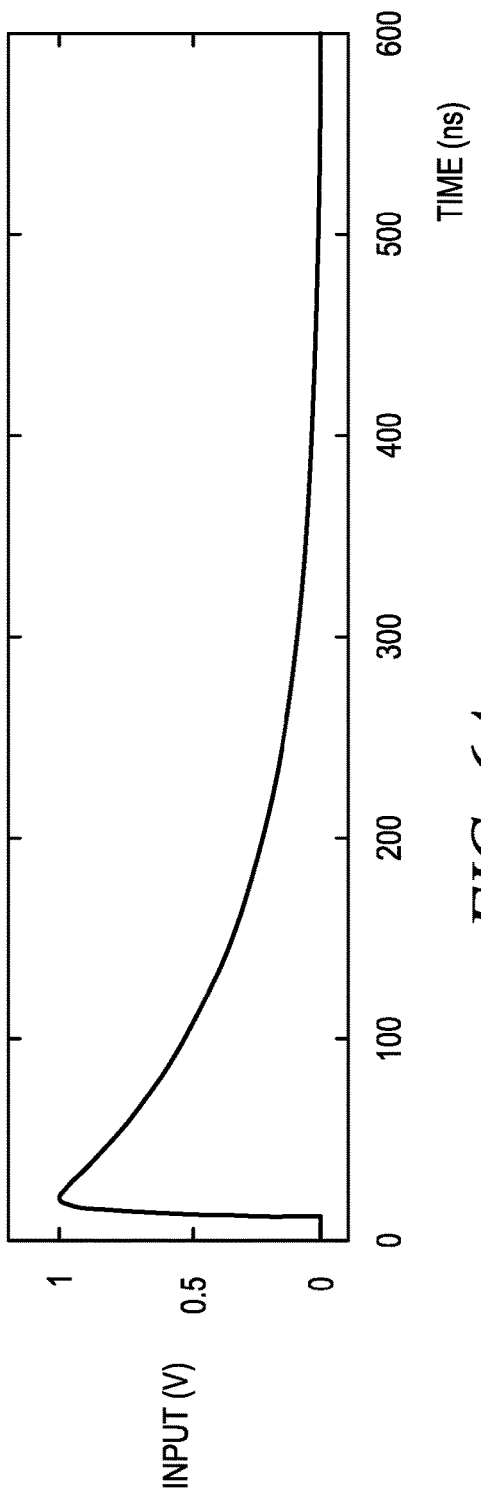
FIG. 6a shows an analog input signal that is digitized using the conventional one-bit sigma-delta modulator.
Figure 6B:
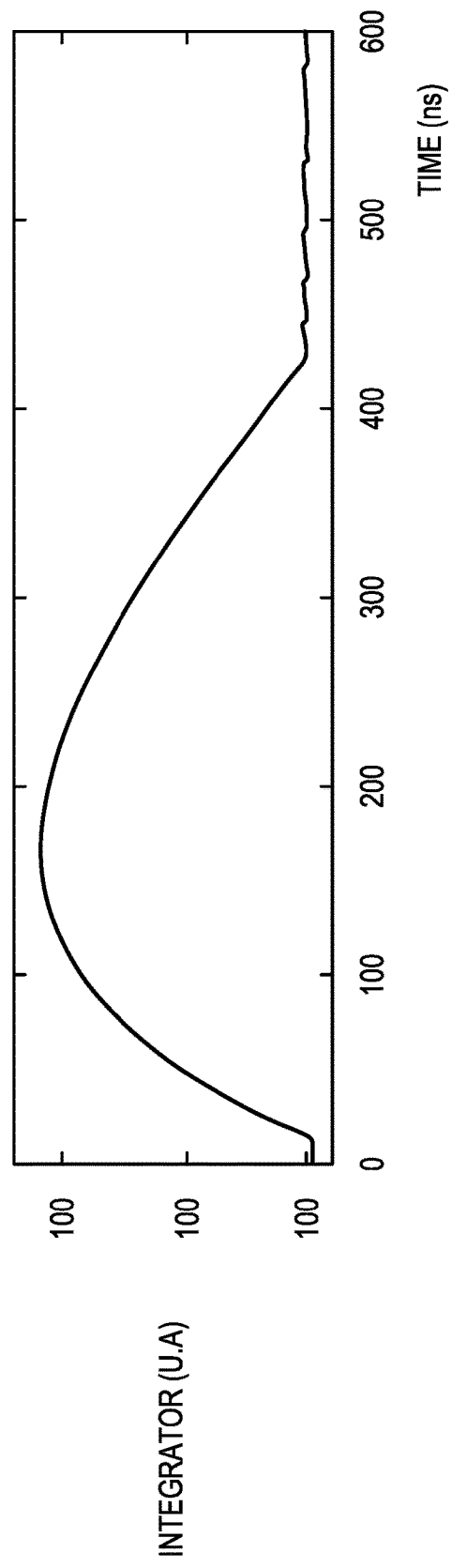
FIG. 6b shows the output from the integrator.
Figure 6C:
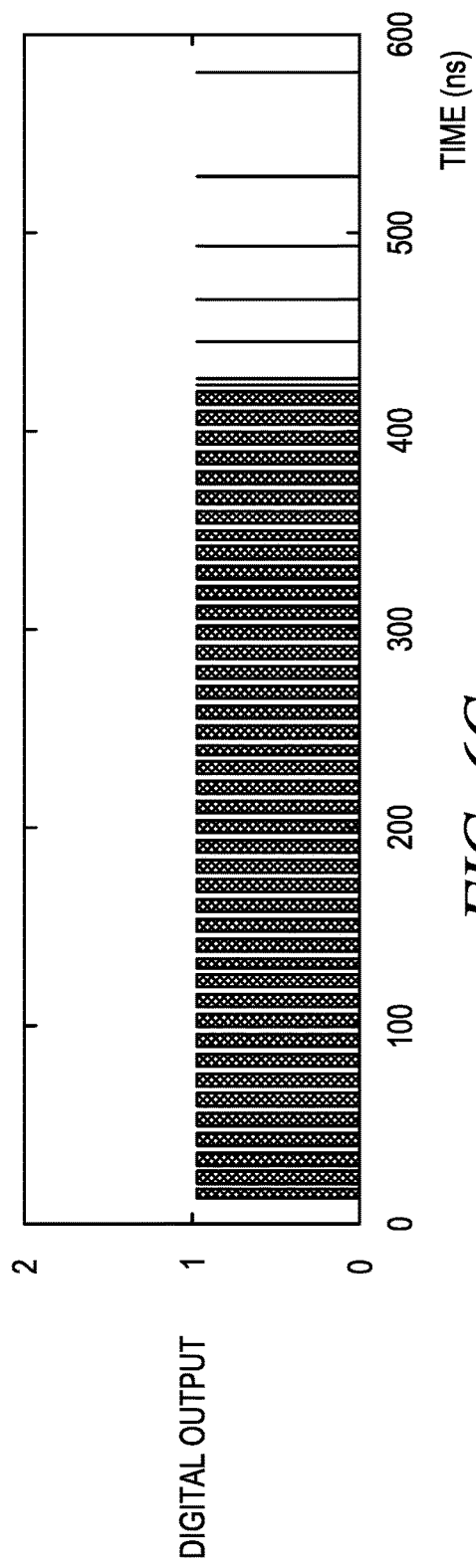
FIG. 6c shows the decoded digital output signal.
Figure 6D:
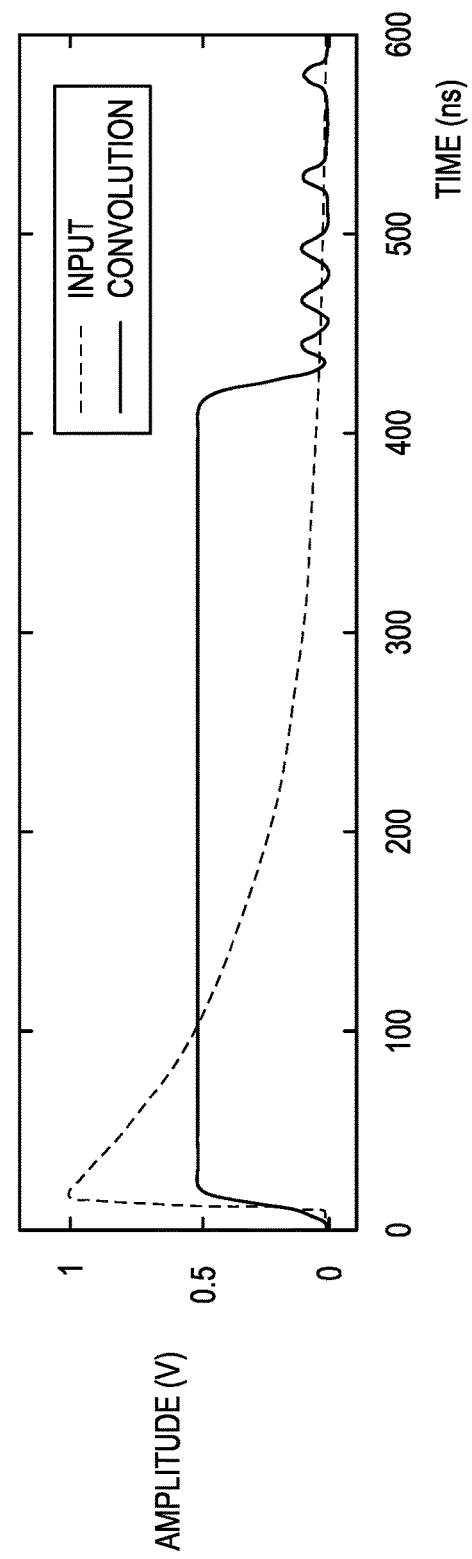
FIG. 6d shows the amplitude of the reconstructed signal.
Figure 7A:
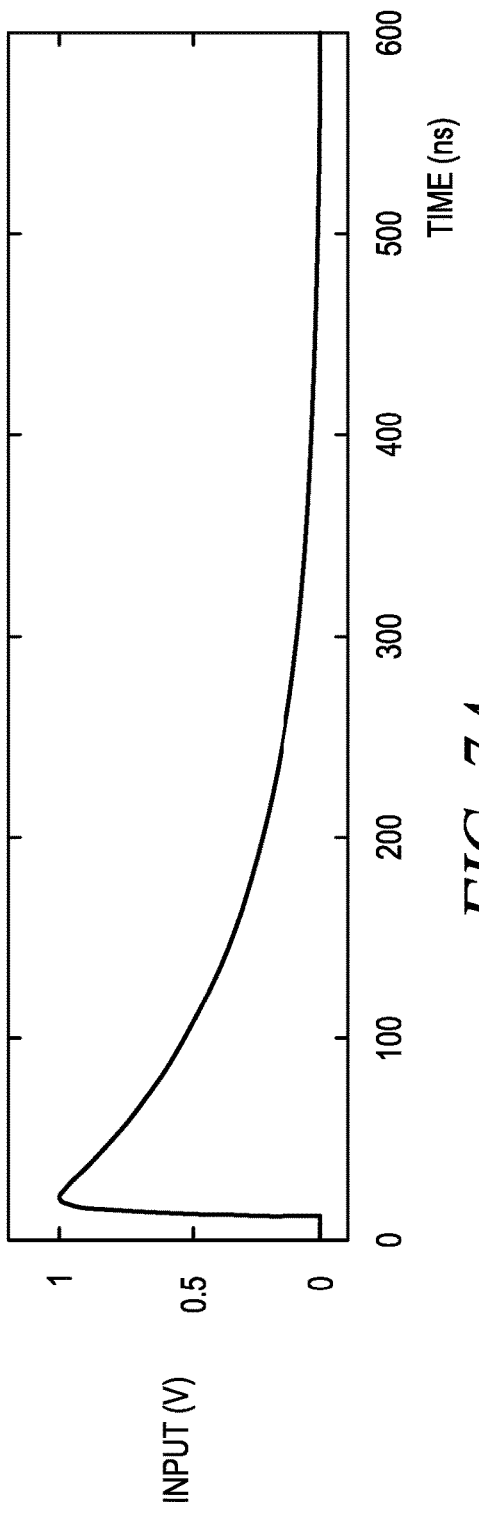
FIG. 7a shows the same analog input signal as in FIG. 6a, which is digitized using a multi-bit sigma-delta modulator described herein.
Figure 7B:
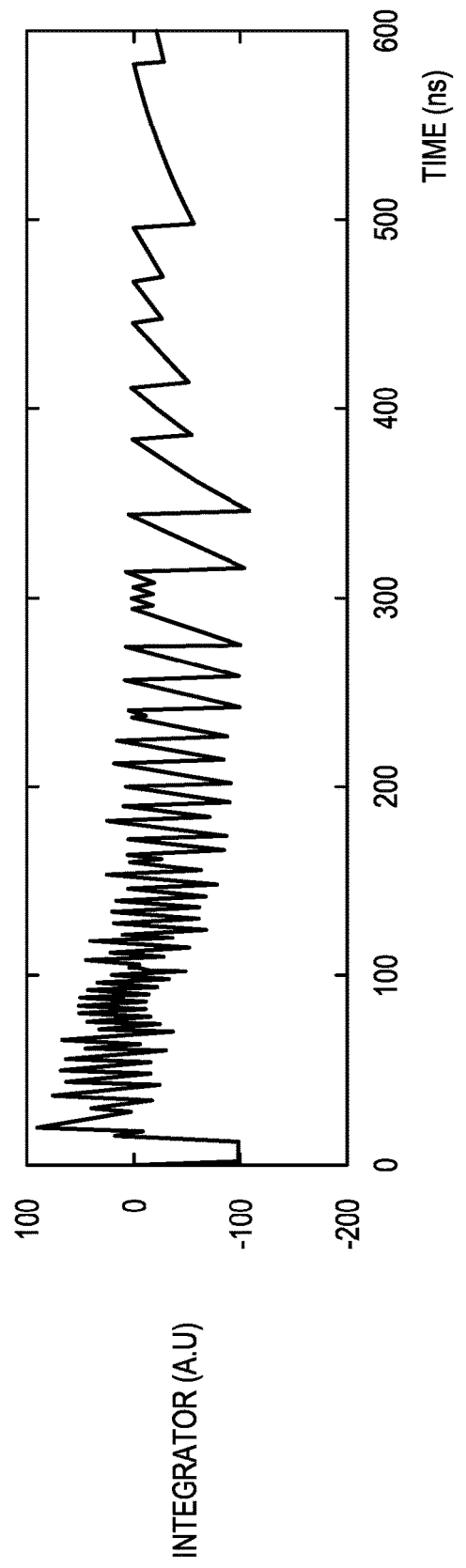
FIG. 7b shows the output from the integrator.
Figure 7C:
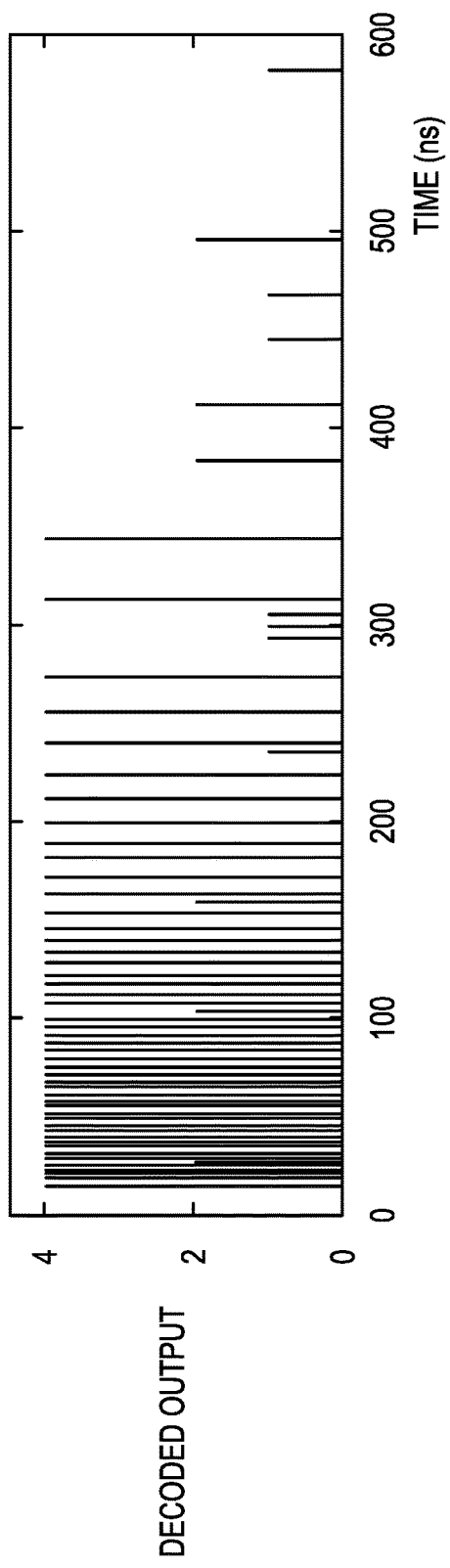
FIG. 7c shows the decoded digital output signal.
Figure 7D:
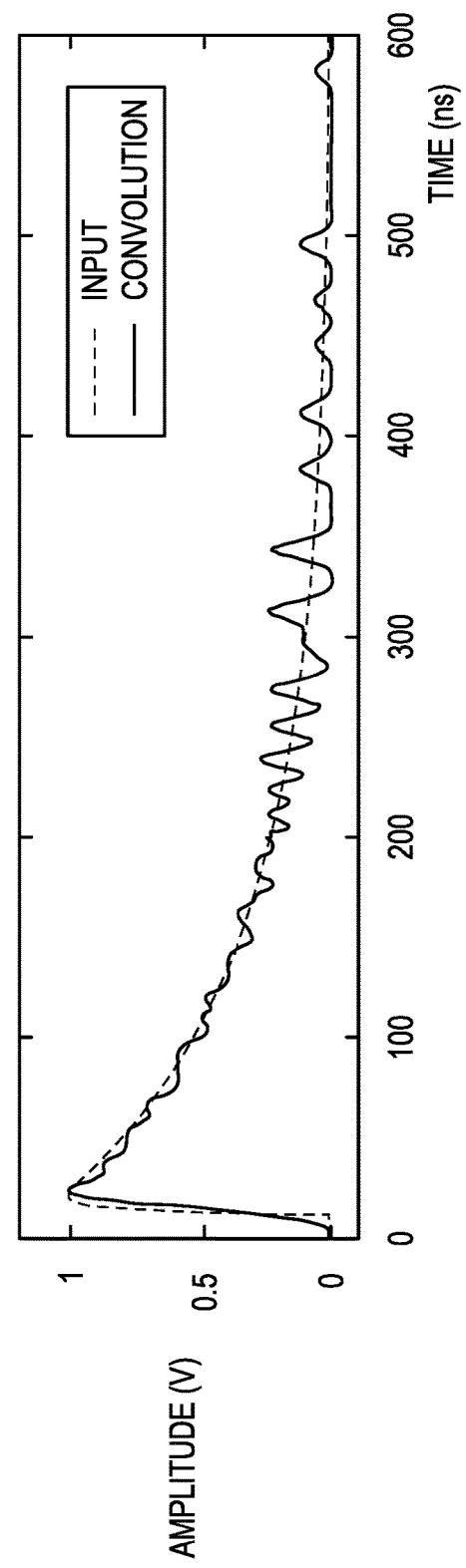
FIG. 7d shows the amplitude of the reconstructed signal.

FIG. 6a shows an analog input signal that is digitized using the conventional one-bit sigma-delta modulator. FIG. 7a shows the same analog input signal, which is digitized using a multi-bit sigma-delta modulator described herein. The analog input signal in these figures is represented by a scintillation pulse. FIGS. 6b and 7b show the output from the integrator, FIGS. 6c and 7c show the decoded digital output signal and FIGS. 6d and 7d show the amplitude of the reconstructed signal, obtained by convolving the digital output with a Gaussian kernel and scaling the result in order to easily observe that the two-bit output conveys information about the pulse shape.

In the conventional one-bit sigma-delta modulator case shown in FIGS. 6a-6d, for a DAC value selected for suitable resolution and dynamic range, the system passes through a period of overload. During this period the integrated energy is preserved, but the shape of the pulse is lost. In order to recover the pulse shape, the two-bit sigma-delta modulator uses three DACs optimized for the intrinsic characteristics of the scintillation crystal, such as rise- and decay-time. By subtracting the correct amount of current, the modulator is able to keep up with the sudden changes in the input signal.

Sometimes, applications may need to recover conventional pulse representations (amplitude versus time). The waveform can be recovered by applying a smoothing filter to the multi-bit modulation. A different filter may be used for each modulation level, recognizing for example that large differences between levels are associated with fast rising edges. The characteristics of each filter can be optimized for specific pulse shapes.

The multi-bit sigma-delta modulator described herein may be used, for example, to digitize electronic signals that arrive in pulses on an otherwise slowly varying baseline, such as those which occur when an energetic photon or particle interacts in a scintillation crystal read out by scintillation light sensors, such as photomultiplier tubes or their solid-state counterparts, or in so-called direct conversion semiconductor detectors, such as silicon or cadmium telluride photodiodes. The modulator may be particularly applicable for any application that needs to digitize rapidly changing signals while using a minimum number of bits, such as situations where many signals need to be digitized and processed in parallel, for example. Such applications may include medical imaging (SPECT, PET and CT, digital autoradiography, microdosimetry), homeland security, non-proliferation verification, high-energy astrophysics/astronomy, nuclear physics, 3D laser scanning, lidar, radar, sonar, etc.

The embodiments of the adaptive multi-bit sigma-delta modulator described above are largely applicable to unipolar analog signals. More generally, however, embodiments of the adaptive multi-bit sigma-delta modulator described herein may be used to digitize bipolar analog signals as well. Such a capability allows the modulator to be used in additional applications, such as in connection with semiconductor detectors that have transient bipolar pulses in neighboring electrodes that carry depth of interaction information.

Figure 8:
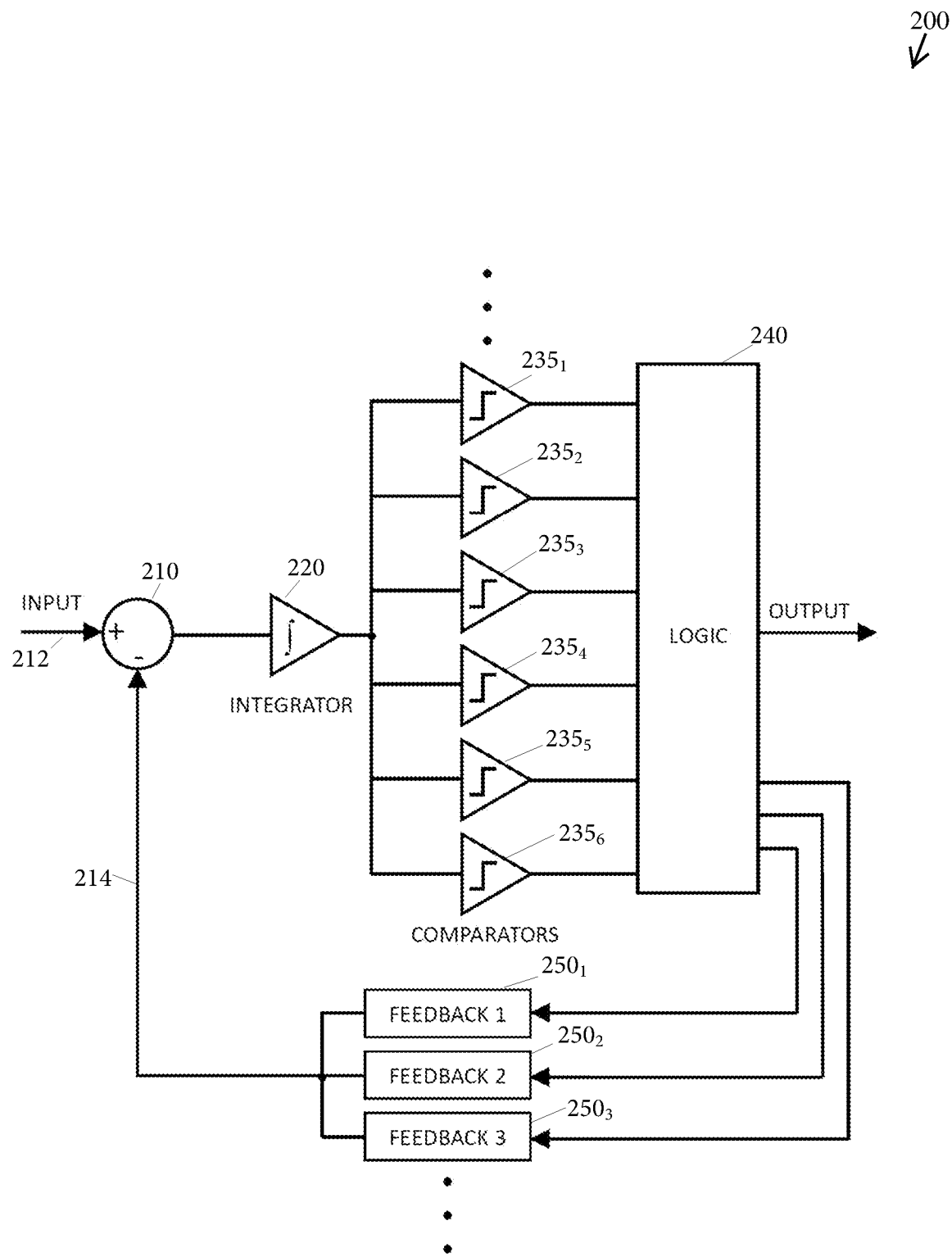
FIG. 8 shows a schematic block diagram of one alternative example of a two-bit sigma-delta modulator.

When employed to encode a bipolar analog signal, a single bit sigma-delta modulator employs bipolar feedback DACs in which the output takes the value reference voltage $V_{ref}$ when the digital output is 1 and $-V_{ref}$ when the digital output is 0. Similarly, in a multi-bit sigma-delta modulator for encoding a bipolar analog signal, the output of each bipolar feedback DAC takes the DAC voltage reference $V_{ref}$ when the digital output is 1, and $-V_{ref}$ when the digital output is 0 (instead of $V_{ref}$ and 0, as is the case of a modulator encoding a unipolar signal). In this embodiment employing bipolar feedback DACs, the number of DACs is the same as in a modulator that encodes a unipolar signal, but the number of comparators is doubled since one polarity is associated with the positive reference voltage and the other polarity is associated with the negative reference voltage. Also, in this configuration each polarity has the same proportion between digital steps of the digital output signal, i.e., the absolute value of the analog signal corresponding to D and −D is the same, where D is the digital output. One example of such an adaptive multi-bit sigma-delta modulator for encoding bipolar analog signals is shown in FIG. 8. In FIGS. 3 and 8, like reference numerals denote like elements, except that in FIG. 8 the DACs $250_1$, $250_2$ and $250_3$ are bipolar.

In an alternative embodiment of an adaptive multi-bit sigma-delta modulator that encodes bipolar analog signals, unipolar feedback DACs are employed instead of bipolar feedback DACs. In this embodiment the number of DACs and comparators that is required is doubled compared to the unipolar case. In this configuration, for each digital step there is positive and a negative feedback DAC. One advantage of this configuration is that the positive and negative voltage ranges of the input signal can be optimized individually.

Embodiments of the multi-bit sigma-delta modulator may be implemented in hardware, software, firmware, middleware, microcode, hardware description languages, or any combination thereof. When implemented in software, firmware, middleware, or microcode, the program code or code segments to perform the necessary tasks may be stored in a computer-readable storage medium and executed by one or more processors. Moreover, various aspects of the modulator can be implemented with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein.

The invention claimed is:

1. A delta sigma modulator comprising:
a summation circuit configured to produce a difference signal between a unipolar or bipolar analog input signal and an analog feedback signal;
at least one integrator operatively coupled to the summation circuit to integrate the difference signal;
a multi-bit quantizer operatively coupled to the at least one integrator to digitize the integrated signal to generate an N-bit digital output signal, N being an integer greater than 1; and
a negative feedback circuit operatively coupling the multi-bit quantizer to the summation circuit, the negative feedback circuit including a digital-to-analog converter arrangement for receiving the N-bit digital output signal and providing the analog feedback signal such that digital values of the N-bit digital output signal and values of the analog feedback encoded by the digital values have a non-linear relationship to one another, wherein the non-linear relationship between the digital values of the N-bit digital output signal and the values of the analog feedback signal encoded by the digital values is tailored to characteristics of the analog input signal to thereby produce an accurate representation of the analog input signal.

2. The delta sigma modulator of claim 1 wherein the analog input signal is a bipolar analog signal and the digital-to-analog converter arrangement includes a bipolar digital-to-analog converter arrangement.

3. The delta sigma modulator of claim 2 wherein the multi-bit quantizer includes a plurality of comparators and the digital-to-analog converter arrangement includes a plurality of bipolar digital-to-analog converters, the plurality of comparators including twice as many comparators as bipolar digital-to-analog converters included in the plurality of bipolar digital-to-analog converters.

4. The delta sigma modulator of claim 3 wherein the negative feedback circuit provides the analog feedback signal such that each polarity of the bipolar analog signal having a common magnitude has an N-bit digital output signal with a common magnitude.

5. The delta sigma modulator of claim 1 wherein the analog input signal is a bipolar signal and the digital-to-analog converter arrangement includes a plurality of unipolar digital-to-analog converters.

6. The delta sigma modulator of claim 1, wherein the non-linear relationship between the digital values of the N-bit digital output signal and between the values of the analog feedback signal encoded by the digital values is adjustable.

7. The delta sigma modulator of claim 1, wherein the non-linear relationship between the digital values of the N-bit digital output signal and between the values of the analog feedback signal encoded by the digital values is programmable.

8. The delta sigma modulator of claim 1, wherein the non-linear relationship between the digital values of the N-bit digital output signal and between the values of the analog feedback signal encoded by the digital values is fixed.

9. The delta sigma modulator of claim 1, wherein the multi-bit quantizer includes a comparator arrangement configured to compare the integrated signal to at least three thresholds and generate an N-bit digital output signal that reflects which of the at least three thresholds were exceeded, a difference between at least two pairs of successive thresholds being unequal to one another.

10. The delta sigma modulator of claim 1, wherein the non-linear relationship between the digital values of the N-bit digital output signal and the values of the analog feedback signal encoded by the digital values is tailored to characteristics of a detector that generates the analog input signal to thereby produce an accurate representation of the analog input signal.

11. The delta sigma modulator of claim 1, wherein the non-linear relationship between the digital values of the N-bit digital output signal and the values of the analog feedback signal encoded by the digital values is tailored based on application specific characteristics to thereby produce an accurate representation of the analog input signal.

12. A method for digitizing a unipolar or bipolar analog input signal, comprising:
    directing the unipolar or bipolar analog input signal to an input of a multi-bit delta sigma modulator that generates an N-bit digital output signal, N being an integer greater than 1, wherein digital values of the N-bit digital output signal and values of the analog feedback encoded by the digital values have a non-linear relationship to one another; and
    adjusting the nonlinear relationship between the digital values of the N-bit digital output signal and the values of the analog feedback encoded by the digital values, wherein the adjusting is performed based at least in part on characteristics of a detector that generates the analog input signal.

13. The method of claim 12, wherein the adjusting is performed based at least in part on characteristics of the analog input signal.

14. The method of claim 12, wherein the adjusting is performed based at least in part on application specific characteristics.

15. A delta sigma modulator comprising:
    a summation circuit configured to produce a difference signal between a unipolar or bipolar analog input signal and an analog feedback signal;
    at least one integrator operatively coupled to the summation circuit to integrate the difference signal;
    a multi-bit quantizer operatively coupled to the at least one integrator to digitize the integrated signal to generate an N-bit digital output signal, N being an integer greater than 1; and
    a negative feedback circuit operatively coupling the multi-bit quantizer to the summation circuit, the negative feedback circuit including a plurality of digital-to-analog converters that are separately addressable by the N-bit digital output signal received from the multi-bit quantizer, wherein each DAC has a different scaling factor between a received value of the N-bit digital output signal and a corresponding output signal, wherein the negative feedback circuit includes $2^N-1$ bipolar digital-to-analog converters or $2(2^N-1)$ unipolar digital-to-analog converters.

\* \* \* \* \*